(12) United States Patent
Yang

(10) Patent No.: US 12,248,007 B2
(45) Date of Patent: Mar. 11, 2025

(54) APPARATUS FOR MEASURING VOLTAGE

(71) Applicant: HYUNDAI MOBIS CO., LTD., Seoul (KR)

(72) Inventor: Su Hun Yang, Yongin-si (KR)

(73) Assignee: Hyundai Mobis Co., Ltd., Seoul (KR)

( * ) Notice: Subject to any disclaimer, the term of this patent is extended or adjusted under 35 U.S.C. 154(b) by 83 days.

(21) Appl. No.: 18/116,523

(22) Filed: Mar. 2, 2023

(65) Prior Publication Data
US 2024/0159805 A1    May 16, 2024

(30) Foreign Application Priority Data
Nov. 15, 2022   (KR) .......................... 10-2022-0152608

(51) Int. Cl.
| | | |
|---|---|---|
| G01R 19/25 | (2006.01) | |
| H01M 10/48 | (2006.01) | |
| H03M 3/00 | (2006.01) | |

(52) U.S. Cl.
CPC ........ *G01R 19/2509* (2013.01); *H01M 10/48* (2013.01); *H03M 3/458* (2013.01)

(58) Field of Classification Search
CPC .... G01R 19/2509; H01M 10/48; H03M 3/458
USPC .............................. 324/500, 600, 76.11, 140 R
See application file for complete search history.

(56) References Cited

U.S. PATENT DOCUMENTS

| | | | |
|---|---|---|---|
| 10,698,036 B2 | 6/2020 | Kobayashi | |
| 11,277,143 B1* | 3/2022 | Kundu ..................... | H03L 7/093 |
| 2010/0007350 A1* | 1/2010 | Denning ............. | H02J 7/00302 |
| | | | 324/427 |
| 2012/0044014 A1* | 2/2012 | Stratakos ............. | H03K 17/145 |
| | | | 327/530 |

(Continued)

FOREIGN PATENT DOCUMENTS

KR    10-1527136 B1    6/2015

OTHER PUBLICATIONS

Zierhofer, Clemens M. "Analysis of A Switched-Capacitor Second-Order Delta-Sigma Modulator Using Integrator Multiplexing." IEEE Transactions on Circuits and Systems II: Express Briefs 53.8 (2006): 787-791.

(Continued)

*Primary Examiner* — Raul J Rios Russo
*Assistant Examiner* — Trung Q Nguyen
(74) *Attorney, Agent, or Firm* — NSIP Law

(57) ABSTRACT

Disclosed herein is an apparatus for measuring a voltage. The apparatus includes a primary integrator circuit configured to operate as a first integral stage of a sigma-delta analog-to-digital converter circuit when switched by a first control signal from a controller, a secondary integrator circuit configured to operate as a second integral stage when switched by a second control signal from the controller, a comparator configured to compare final voltages modulated through the primary integrator circuit and the secondary integrator circuit, and a digital filter configured to delay an (Continued)

output of the comparator by a specified number of clocks according to a switching of the controller, pass the delayed output through a digital-to-analog converter (DAC) to feed the delayed output back to the primary and secondary integrator circuits, and receive the delayed output signal of the comparator as an input. An output of the digital filter becomes a final measured value.

10 Claims, 4 Drawing Sheets

(56) References Cited

U.S. PATENT DOCUMENTS

| | | |
|---|---|---|
| 2014/0043032 A1 | 2/2014 | Makino et al. |
| 2014/0354353 A1* | 12/2014 | Hampel ................ H03F 3/2171 330/10 |
| 2016/0285471 A1 | 9/2016 | Imaizumi |
| 2017/0018945 A1* | 1/2017 | Ohtake .............. G01R 31/3835 |
| 2021/0075413 A1* | 3/2021 | Kawai .................... H03K 5/249 |
| 2023/0018398 A1* | 1/2023 | Whitcombe ............. H03K 5/06 |

OTHER PUBLICATIONS

Extended European search report issued on Aug. 24, 2023, in counterpart European Patent Application No. 23159308.8 (10 pages).

\* cited by examiner

US 12,248,007 B2

APPARATUS FOR MEASURING VOLTAGE

CROSS-REFERENCE TO RELATED APPLICATION

This application claims the benefit under 35 USC § 119(a) of Korean Patent Application No. 10-2022-0152608, filed on Nov. 15, 2022, in the Korean Intellectual Property Office, the entire disclosure of which is incorporated herein by reference for all purposes.

BACKGROUND

1. Field

The present disclosure relates to an apparatus for a voltage, which can improve accuracy and reduce a measurement time with a small area, when measuring a voltage of a battery cell or the like, by increasing an order of an analog-to-digital converter (ADC) without increasing the number of amplifiers of the ADC.

2. Description of Related Art

Generally, in electric vehicles (EVs) and hybrid EVs (HEVs), electric motors are driven by using batteries (or fuel cells).

Therefore, voltage measurement (or voltage monitoring) of each cell of a battery (or fuel cell) is required for voltage control (e.g., voltage balancing control for minimizing a voltage difference between cells).

A voltage measurement circuit used in this case generally employs a method of selecting one of a number of battery cells using a multiplexer (MUX), converting a high voltage into a low voltage, and then detecting the low voltage as a digital value using an analog-to-digital converter (ADC). In this case, since a high voltage element is generally used in order to convert the high voltage into the low voltage, the size of the voltage measurement circuit increases. Therefore, the MUX is used, but a switching element constituting the MUX should also be formed as the high voltage element. Accordingly, there are problems in that the overall size and costs of the apparatus for measuring a voltage increase and a cell voltage sensing speed is limited.

Accordingly, as shown in FIG. 1, a voltage measurement circuit using a primary ADC enabling the use of a low voltage element instead of a high voltage element by integrating a high voltage processing function with an ADC function. However, as shown in FIG. 2, when an order of the ADC is increased to improve voltage measurement accuracy and reduce a measurement time, the number of amplifiers AMPs required for a configuration of a circuit is increased so that there is a problem in that an area (size) of the circuit is increased.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an apparatus for measuring a voltage is provided. The apparatus includes a primary integrator circuit configured to operate as a first integral stage of a sigma-delta analog-to-digital converter circuit when switched by a first control signal from a controller, a secondary integrator circuit configured to operate as a second integral stage when switched by a second control signal from the controller, a comparator configured to compare final voltages modulated through the primary integrator circuit and the secondary integrator circuit, and a digital filter configured to delay an output of the comparator by a specified number of clocks according to a switching of the controller, pass the delayed output through a digital-to-analog converter (DAC) to feed the delayed output back to the primary and secondary integrator circuits, and receive the delayed output signal of the comparator as an input. An output of the digital filter becomes a final measured value.

The sigma-delta ADC may include an amplifier (AMP) for an integrator, the amplifier may be used as an amplifier for an integrator of the primary integrator circuit when the primary integrator circuit operates, and the amplifier may be used as an amplifier for an integrator of the secondary integrator circuit when the secondary integrator circuit operates.

The controller may be configured to output an ST signal to operate the primary integrator circuit and output an ND signal to operate the secondary integrator circuit, the primary integrator circuit may be configured to operate when the ST signal is in a high section, and the secondary integrator circuit may be configured to operate when the ND signal, which is an inverted signal of the ST signal, is in a high section so that the controller may sequentially operate the primary integrator circuit and the secondary integrator circuit.

The primary integrator circuit may include an integrating circuit formed of a first switching capacitor part and the amplifier. The first switching capacitor part may include first, second, and third switching parts. The first switching part may include first and second switches (SW1, SW2) having first contact points commonly connected to a positive (+) terminal of a battery cell (CELL), and third and fourth switches (SW3, SW4) having first contact points commonly connected to a negative (−) terminal of the battery cell (CELL). Second contact points of the first and third switches (SW1, SW3) may be commonly connected. Second contact points of the second and fourth switches (SW2, SW4) may be commonly connected. One set of ends of insulating capacitors (C1-1, C1-2) having the same value may be connected in series to the second contact points of the first and third switches (SW1, SW3) and to the second contact points of the second and fourth switches (SW2, SW4). A fifth switch (SW5) and a sixth switch (SW6) may be connected in series to the other ends of the insulating capacitors (C1-1, C1-2) to be connected to one input terminal and the other input terminal of the amplifier.

The first and fourth switches (SW1, SW4) may be configured to be simultaneously switched on/off by an STX1 signal, the second and third switches (SW2, SW3) may be configured to be simultaneously switched on/off by an STX2 signal which is an inverted signal of the STX1 signal, and the fifth and sixth switches (SW5, SW6) may be simultaneously switched on/off by the ST signal.

The second switching part may include a seventh switch (SW7) having a first contact point configured to receive a second positive measured voltage (DAC2P), an eighth switch (SW8) having a first contact point configured to receive a reference voltage (VCM) and having a second contact point commonly connected to a second contact point of the seventh switch (SW7), an insulating capacitor (C3-1) having one end connected to the second contact point at which the seventh and eighth switches (SW7, SW8) are commonly connected, a ninth switch (SW9) having a first contact point which receives the reference voltage VCM and having a second contact point connected to the other end of the insulating capacitor (C3-1), and a tenth switch (SW10) having a first contact point commonly connected to the second contact point of the ninth switch (SW9) and the other end of the insulating capacitor (C3-1) and having a second contact point connected to the one input terminal of the amplifier (AMP), wherein the second positive measured voltage (DAC2P) may be a voltage that is feedback of a positive voltage output from a second digital-to-analog converter (DAC2) after the ST signal is delayed by two clocks through a second D flip-flop of a voltage output circuit.

The seventh and ninth switches (SW7, SW9) may be configured to be simultaneously switched on/off by an STQ1 signal, and the eighth and tenth switches (SW8, SW10) may be configured to be simultaneously switched on/off by an STQ2 signal.

The third switching part may include an eleventh switch (SW11) having a first contact point configured to receive a second negative measured voltage DAC2N, a twelfth switch (SW12) having a first contact point configured to receive the reference voltage (VCM) and having a second contact point commonly connected to a second contact point of the eleventh switch (SW11), an insulating capacitor (C3-2) having one end connected to the second contact point at which the eleventh and twelfth switches (SW11, SW12) are commonly connected, a thirteenth switch (SW13) having a first contact point which receives the reference voltage (VCM) and having a second contact point connected to the other end of the insulating capacitor (C3-2), and a fourteenth switch (SW14) having a first contact point commonly connected to the second contact point of the thirteenth switch (SW13) and the other end of the insulating capacitor (C3-2) and having a second contact point connected to the other input terminal of the amplifier (AMP), wherein the second negative measured voltage (DAC2N) may be a voltage that is feedback of a negative voltage output from the second DAC (DAC2) after the ST signal is delayed by two clocks through the second D flip-flop of the voltage output circuit.

The eleventh and thirteenth switches (SW11, SW13) may be configured to be simultaneously switched on/off by the STQ1 signal, the twelfth and fourteenth switches (SW12, SW14) may be simultaneously switched on/off by the STQ2 signal, and the STQ1 signal and the STQ2 signal may be output when the ST signal is in a high section while the primary integrator circuit operates.

The secondary integrator circuit may include an integrating circuit formed of a second switching capacitor part and the amplifier (AMP); the second switching capacitor part may include fourth, fifth, sixth, and seventh switching parts; the fourth switching part may include a seventeenth switch (SW17) having a first contact point configured to receive an amplifier positive output voltage (VOUTP), an eighteenth switch (SW18) having a first contact point configured to receive the reference voltage (VCM) and having a second contact point commonly connected to a second contact point of the seventeenth switch (SW17), an insulating capacitor (C5-1) having one end connected to the second contact point at which the seventeenth and eighteenth switches (SW17, SW18) are commonly connected, a nineteenth switch (SW19) having a first contact point which receives the reference voltage (VCM) and having a second contact point connected to the other end of the insulating capacitor (C5-1), and a twentieth switch (SW20) having a first contact point commonly connected to the second contact point of the nineteenth switch (SW19) and the other end of the insulating capacitor (C5-1) and having a second contact point connected to the one input terminal of the amplifier (AMP), and the amplifier positive output voltage (VOUTP) may be a voltage that is feedback of a positive voltage output from the amplifier (AMP).

The seventeenth and nineteenth switches (SW17, SW19) may be configured to be simultaneously switched on/off by an NDQ1 signal, and the eighteenth and twentieth switches (SW18, SW20) may be simultaneously switched on/off by an NDQ2 signal.

The fifth switching part may include a twenty-first switch (SW21) having a first contact point configured to receive a first positive measured voltage DAC1P, a twenty-second switch (SW22) having a first contact point configured to receive the reference voltage (VCM) and having a second contact point commonly connected to a second contact point of the twenty-first switch (SW21), an insulating capacitor (C6-1) having one end connected to the second contact point at which the twenty-first and twenty-second switches (SW21, SW22) are commonly connected, a twenty-third switch (SW23) having a first contact point configured to receive the reference voltage (VCM) and having a second contact point connected to the other end of the insulating capacitor (C6-1), and a twenty-fourth switch (SW24) having a first contact point commonly connected to the second contact point of the twenty-third switch (SW23) and the other end of the insulating capacitor (C6-1) and having a second contact point connected to the one input terminal of the amplifier (AMP), wherein the first positive measured voltage (DAC1P) may be a voltage that is feedback of a positive voltage output from a first DAC (DAC1) after the ST signal is delayed by one clock through a first D flip-flop of the voltage output circuit.

The twenty-first and twenty-third switches (SW21, SW23) may be configured to be simultaneously switched on/off by the NDQ1 signal, and the twenty-second and twenty-fourth switches (SW22, SW24) may be configured to be simultaneously switched on/off by the NDQ2 signal.

The sixth switching part may include a twenty-sixth switch (SW26) having a first contact point configured to receive an amplifier negative output voltage (VOUTN), a twenty-seventh switch (SW27) having a first contact point configured to receive the reference voltage (VCM) and having a second contact point commonly connected to a second contact point of the twenty-sixth switch (SW26), an insulating capacitor (C5-2) having one end connected to the second contact point at which the twenty-sixth and twenty-seventh switches (SW26, SW27) are commonly connected, a twenty-eighth switch (SW28) having a first contact point configured to receive the reference voltage (VCM) and having a second contact point connected to the other end of the insulating capacitor (C5-2), and a twenty-ninth switch (SW29) having a first contact point commonly connected to the second contact point of the twenty-eighth switch (SW28) and the other end of the insulating capacitor (C5-2) and having a second contact point connected to the other input terminal of the amplifier (AMP), wherein the amplifier negative output voltage (VOUTN) may be a voltage that is feedback of a negative voltage output from the amplifier (AMP).

The twenty-sixth and twenty-eighth switches (SW26, SW28) may be configured to be simultaneously switched on/off by the NDQ1 signal, and the twenty-seventh and twenty-ninth switches (SW27, SW29) may be configured to be simultaneously switched on/off by the NDQ2 signal.

The seventh switching part may include a thirtieth switch (SW30) having a first contact point configured to receive a first negative measured voltage (DAC1N), a thirty-first switch (SW31) having a first contact point configured to receive the reference voltage (VCM) and having a second contact point commonly connected to a second contact point of the thirtieth switch (SW30), an insulating capacitor (C6-2) having one end connected to the second contact point at which the thirtieth and thirty-first switches (SW30, SW31) are commonly connected, a thirty-second switch (SW32) having a first contact point configured to receive the reference voltage (VCM) and having a second contact point connected to the other end of the insulating capacitor (C6-2), and a thirty-third switch (SW33) having a first contact point commonly connected to the second contact point of the thirty-second switch (SW32) and the other end of the insulating capacitor (C6-2) and having a second contact point connected to the other input terminal of the amplifier (AMP), wherein the first negative measured voltage (DAC1N) may be a voltage that is feedback of a negative voltage output from the first DAC (DAC1) after the ST signal is delayed by one clock through the first D flip-flop of the voltage output circuit.

Thirtieth and thirty-second switches (SW30, SW32) may be configured to be simultaneously switched on/off by the NDQ1 signal, the thirty-first and thirty-third switches (SW31, SW33) may be configured to be simultaneously switched on/off by the NDQ2 signal, and the NDQ1 signal and the NDQ2 signal may be output when the ND signal is in a high section while the secondary integrator circuit operates.

A capacitor (C2-1) and a fifteenth switch (SW15), which are connected in series, may be connected between one input terminal and one output terminal of the amplifier (AMP); a capacitor (C4-1) and a twenty-fifth switch (SW25), which are connected in series, may be connected between the one input terminal and the one output terminal; a reset switch may be connected between the one input terminal and the one output terminal; a capacitor (C2-2) and a sixteenth switch (SW16), which are connected in series, may be connected between the other input terminal and the other output terminal of the amplifier (AMP); a capacitor (C4-2) and a thirty-fourth (SW34), which are connected in series, may be connected between the other input terminal and the other output terminal; and a reset switch (RST) may be connected between the other input terminal and the other output terminal.

The apparatus for measuring a voltage may include a voltage output circuit. The voltage output circuit may include a first D flip-flop configured to receive one output and the other output of the comparator, a second D flip-flop connected to one output terminal and the other output terminal of the first D flip-flop, and a digital filter configured to filter and output voltages output from one output terminal and the other output terminal of the second D flip-flop. A first DAC (DAC1) may be connected parallel to the one output terminal and the other output terminal of the first D flip-flop to feed a first positive measured voltage (DAC1P) and a first negative measured voltage (DAC1N) back to the secondary integrator circuit, and a second DAC (DAC2) is connected parallel to the one output terminal and the other output terminal of the second D flip-flop to feed a second positive measured voltage (DAC2P) and a second negative measured voltage (DAC2N) back to the primary integrator circuit.

Other features and aspects will be apparent from the following detailed description, the drawings, and the claims.

Figure 1:
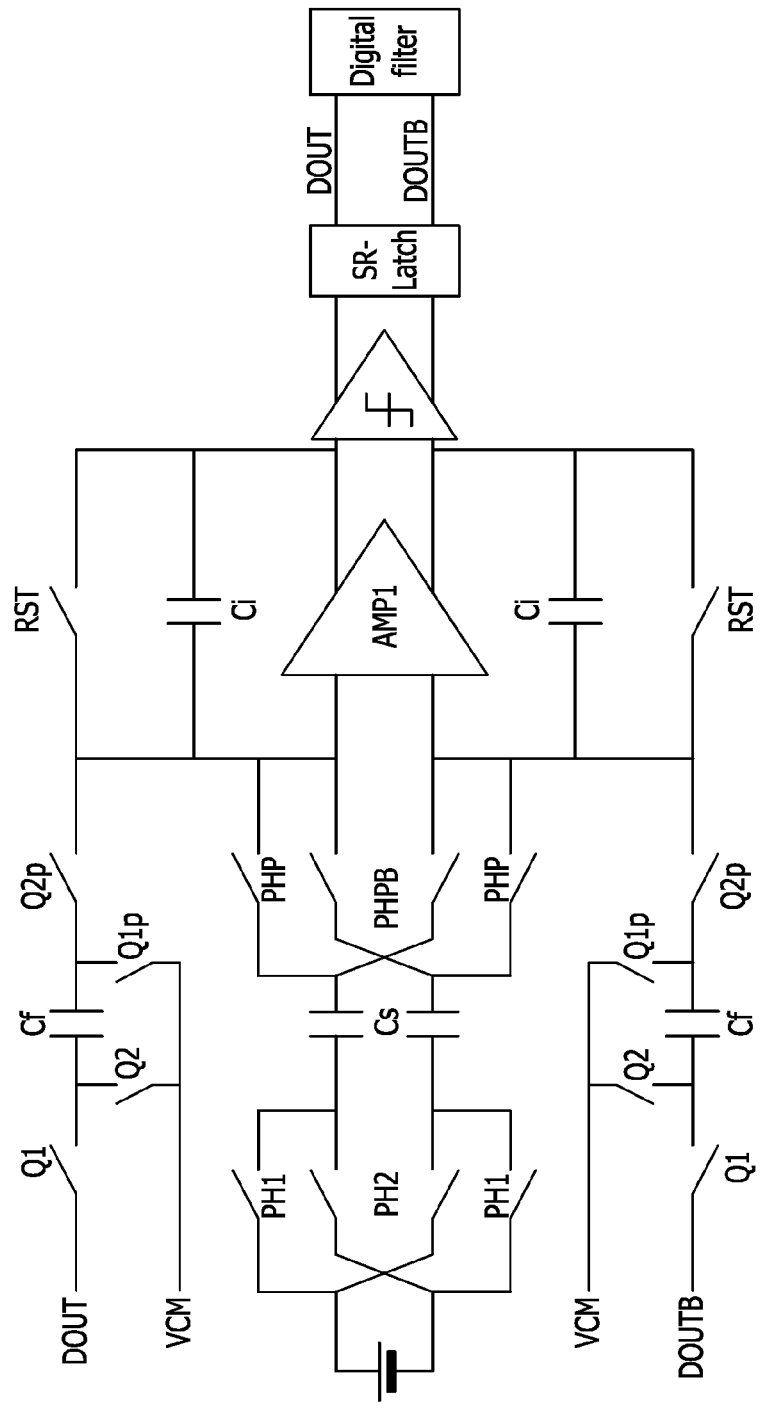
FIG. 1 is a diagram illustrating a schematic configuration of an apparatus for measuring a voltage, which is configured using a conventional primary analog-to-digital converter (ADC).

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order.

The features described herein may be embodied in different forms and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Advantages and features of the present disclosure and methods of achieving the advantages and features will be clear with reference to embodiments described in detail below together with the accompanying drawings. However, the present disclosure is not limited to the embodiments disclosed herein but will be implemented in various forms. The embodiments of the present disclosure are provided so that the present disclosure is adequately disclosed, and a person with ordinary skill in the art can fully understand the scope of the present disclosure. Meanwhile, the terms used in the present specification are for explaining the embodiments, not for limiting the present disclosure.

Terms, such as first, second, A, B, (a), (b) or the like, may be used herein to describe components. Each of these terminologies is not used to define an essence, order or sequence of a corresponding component but used merely to distinguish the corresponding component from other component(s). For example, a first component may be referred to as a second component, and similarly the second component may also be referred to as the first component.

Throughout the specification, when a component is described as being "connected to," or "coupled to" another component, it may be directly "connected to," or "coupled to" the other component, or there may be one or more other components intervening therebetween. In contrast, when an element is described as being "directly connected to," or "directly coupled to" another element, there can be no other elements intervening therebetween.

The singular forms "a", "an", and "the" are intended to include the plural forms as well, unless the context clearly indicates otherwise. It will be further understood that the terms "comprises/comprising" and/or "includes/including" when used herein, specify the presence of stated features, integers, steps, operations, elements, and/or components, but do not preclude the presence or addition of one or more other features, integers, steps, operations, elements, components and/or groups thereof.

The features of the examples described herein may be combined in various ways as will be apparent after an understanding of the disclosure of this application. Further, although the examples described herein have a variety of configurations, other configurations are possible as will be apparent after an understanding of the disclosure of this application.

Hereinafter, an apparatus for measuring a voltage will be described below with reference to the accompanying drawings through various embodiments.

In the following description, thicknesses of lines and sizes of components shown in the drawings may be exaggerated for clarity and convenience of description. In addition, the terms described below are defined in consideration of the functions of the present invention, and these terms may be varied according to the intent of a user or an operator or practice. Therefore, these terms should be defined on the basis of the contents throughout the present application.

Figure 3:
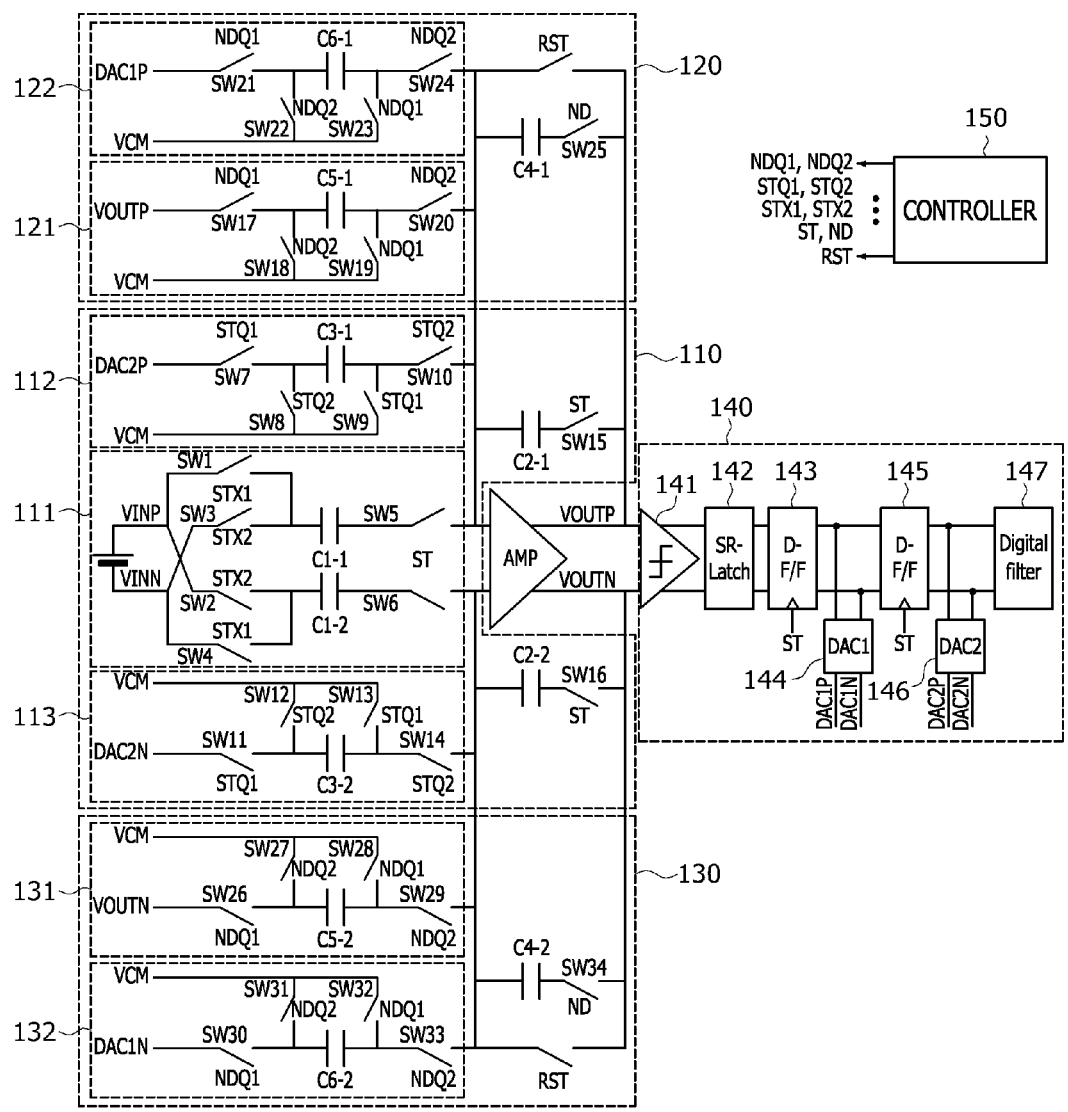
FIG. 3 is a diagram illustrating a circuit configuration of an apparatus for measuring a voltage according to one embodiment of the present disclosure.
Figure 4:
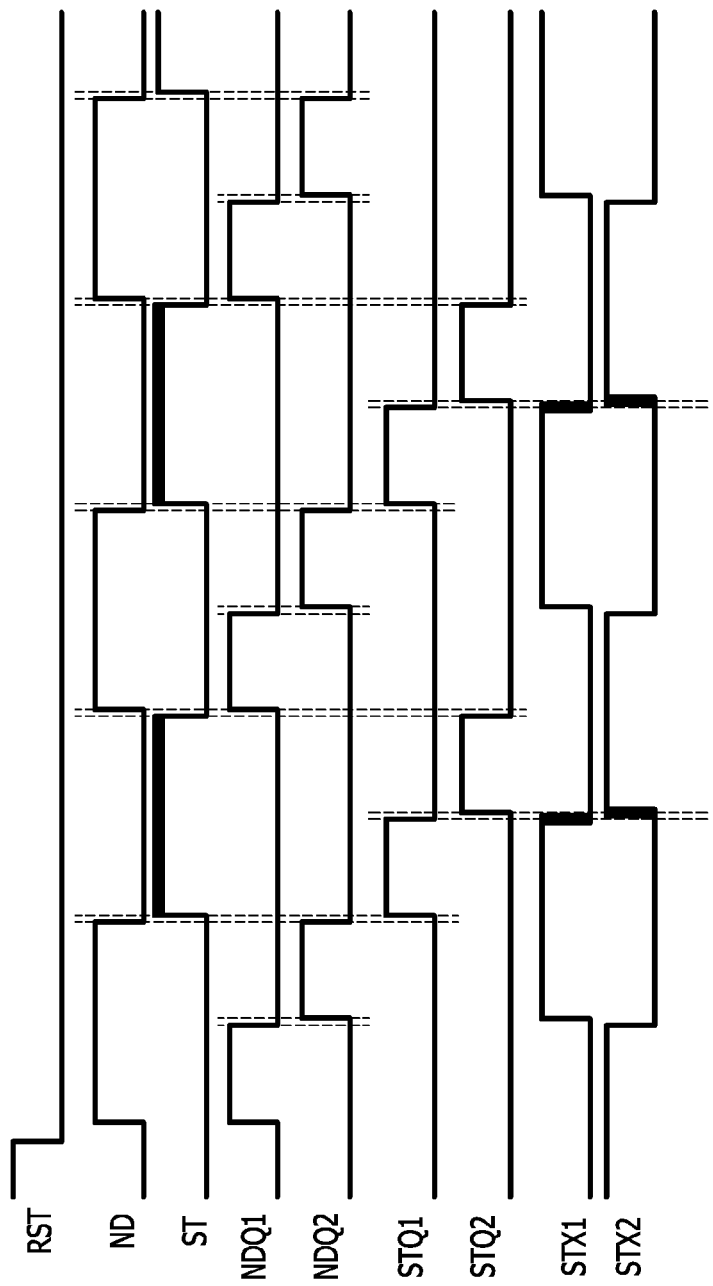
FIG. 4 is a diagram illustrating a timing chart of control signals output from a controller to switches of the apparatus for measuring a voltage shown in FIG. 3.

FIG. 3 is a diagram illustrating a circuit configuration of an apparatus for measuring a voltage according to one embodiment of the present disclosure, and FIG. 4 is a diagram illustrating a timing chart of control signals output from a controller to switches of the apparatus for measuring a voltage shown in FIG. 3.

Referring to FIG. 3, the apparatus for measuring a voltage according to the present embodiment includes a primary integrator circuit 110 configured to operate as a first integral stage of a sigma-delta analog-to-digital converter (ADC) circuit by a switching according to a (for example, first) control signal of a controller 150, secondary integrator circuits 120 and 130 configured to operate as a second integrator stage by the switching (for example, a second control signal) of the controller 150, and a voltage output circuit 140 configured to delay an output of the primary integrator circuit 110 by a specified number of clocks according to the switching (for example, a third control signal) of the controller 150 to feed the delayed output back to the secondary integrator circuits 120 and 130, delay outputs of the secondary integrator circuits 120 and 130 by a specified number of clocks to feed the delayed outputs back to the primary integrator circuit 110, and output a finally measured voltage value through the primary integrator circuit 110 and the secondary integrator circuits 120 and 130.

In this case, in the present embodiment, it is noted that when the primary integrator circuit 110 operates by the switching of the controller 150, an amplifier AMP is used as an amplifier AMP for an integrator of the primary integrator circuit 110 and, when the secondary integrator circuit 120 operates, the AMP is used as an amplifier AMP for an integrator of the secondary integrator circuit 120.

Referring to FIG. 4, when an ST signal is in a high section, the primary integrator circuit 110 operates (for convenience, it is indicated by a thick line), and when an ND signal is in a high section, the secondary integrator circuit 120 operates. In this case, since the ST signal and the ND signal are inverted pulse signals, the primary integrator circuit 110 and the secondary integrator circuit 120 operate sequentially.

Figure 2:
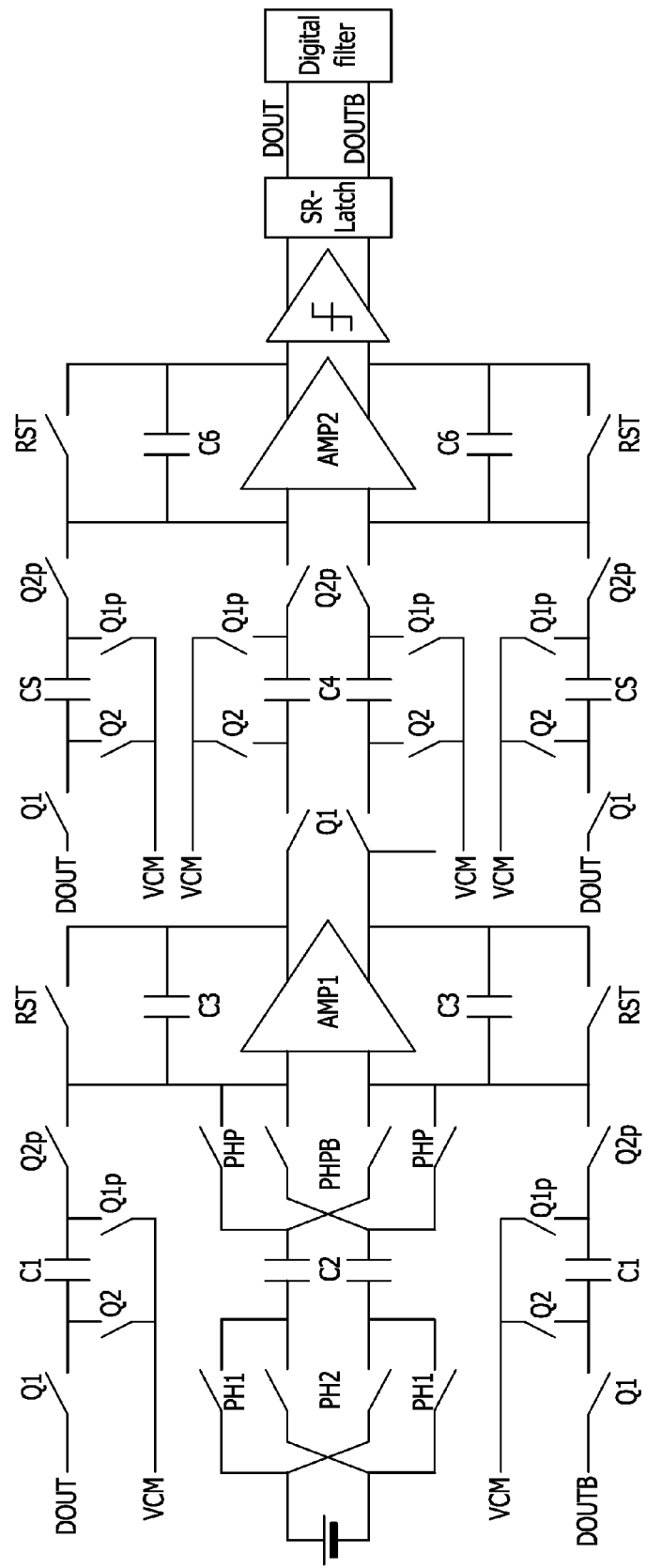
FIG. 2 is a diagram for describing a problem of a case in which the apparatus for measuring a voltage is configured by increasing the number of amplifiers in FIG. 1.

As described above, the present embodiment is characterized in that a circuit in which the primary integrator circuit 110 and the secondary integrator circuit 120 operate sequentially is configured so that a single amplifier AMP is actually used to achieve the same effect as a circuit in which two amplifiers AMP are used as shown in FIG. 2 to increase an order of ADC (e.g., a sigma-delta ADC circuit).

For reference, in the timing chart shown in FIG. 4, a rising edge and a falling edge of each signal actually have a slight time difference, but in an ideal circuit, a time difference between signals is virtually meaningless. Hereinafter, even in the present embodiment, a description will be made on the assumption that there is no time difference between respective signals.

The primary integrator circuit 110 includes an integrating circuit formed of a first switching capacitor part (i.e., first to third switching parts 111 to 113 and capacitors C2-1 and C2-2) and the amplifier AMP, and the secondary integrator circuits 120 and 130 include an integrating circuit formed of a second switching capacitor part (i.e., fourth to seventh switching parts 121, 122, 131, and 132, capacitors C4-1 and C4-2), and the amplifier AMP.

The first switching part 111 includes first and second switches SW1 and SW2 each having a first contact point commonly connected to a positive (+) terminal of a battery cell CELL, and third and fourth switches SW3 and SW4 each having a first contact point commonly connected to a negative (−) terminal of the battery cell CELL. Second contact points of the first and third switches SW1 and SW3 are commonly connected, and second contact points of the second and fourth switches SW2 and SW4 are commonly connected. In addition, one ends of insulating capacitors C1-1 and C1-2 having the same value are connected in series to the second contact points of the first and third switches SW1 and SW3 and the second contact points of the second and fourth switches SW2 and SW4. A fifth switch SW5 and a sixth switch SW6 are connected in series to the other ends of the insulating capacitors C1-1 and C1-2 to be connected to one input terminal (e.g., a non-inverting input terminal) and the other input terminal (e.g., an inverting input terminal) of the amplifier AMP.

In this case, the first and fourth switches SW1 and SW4 are simultaneously switched on/off by an STX1 signal (that is, switched on in a high section and switched off in a low section), the second and third switches SW2 and SW3 are simultaneously switched on/off by an STX2 signal, and the fifth and sixth switches SW5 and SW6 are simultaneously switched on/off by the ST signal.

The second switching part 112 includes a seventh switch SW7 having a first contact point which receives a second positive measured voltage DAC2P (i.e., a voltage which is feedback of a positive voltage output from a second DAC DAC2 146 after the ST signal is delayed by two clocks through a second D flip-flop 145), an eighth switch SW8 having a first contact point which receives a reference voltage VCM and having a second contact point commonly connected to a second contact point of the seventh switch SW7, an insulating capacitor C3-1 having one end connected to the second contact point at which the seventh and eighth switches SW7 and SW8 are commonly connected, a ninth switch SW9 having a first contact point which receives the reference voltage VCM and having a second contact point connected to the other end of the insulating capacitor C3-1, and a tenth switch SW10 having a first contact point commonly connected to the second contact point of the ninth switch SW9 and the other end of the insulating capacitor C3-1 and having a second contact point connected to the one input terminal (e.g., the non-inverting input terminal) of the amplifier AMP.

In this case, the seventh and ninth switches SW7 and SW9 are simultaneously switched on/off by an STQ1 signal (i.e., switched on in a high section and switched off in a low section), and the eighth and tenth switches SW8 and SW10 are simultaneously switched on/off by an STQ2 signal.

The third switching part 113 includes an eleventh switch SW11 having a first contact point which receives a second negative measured voltage DAC2N (i.e., a voltage which is feedback of a negative voltage output from the second DAC DAC2 146 after the ST signal is delayed by two clocks through the second D flip-flop 145), a twelfth switch SW12 having a first contact point which receives the reference voltage VCM and having a second contact point commonly connected to a second contact point of the eleventh switch SW11, an insulating capacitor C3-2 having one end connected to the second contact point at which the eleventh and twelfth switches SW11 and SW12 are commonly connected, a thirteenth switch SW13 having a first contact point which receives the reference voltage VCM and having a second contact point connected to the other end of the insulating capacitor C3-2, and a fourteenth switch SW14 having a first contact point commonly connected to the second contact point of the thirteenth switch SW13 and the other end of the insulating capacitor C3-2 and having a second contact point connected to the other input terminal (e.g., the inverting input terminal) of the amplifier AMP.

In this case, the eleventh and thirteenth switches SW11 and SW13 are simultaneously switched on/off by the STQ1 signal (i.e., switched on in a high section and switched off in a low section), and the twelfth and fourteenth switches SW12 and SW14 are simultaneously switched on/off by the STQ2 signal.

For reference, the STQ1 signal and the STQ2 signal are output when the primary integrator circuit 110 operates (i.e., when the ST signal is in the high section).

The fourth switching part 121 includes a seventeenth switch SW17 having a first contact point which receives an amplifier positive output voltage VOUTP (i.e., a voltage which is feedback of a positive voltage output from the amplifier AMP), an eighteenth switch SW18 having a first contact point which receives the reference voltage VCM and having a second contact point commonly connected to a second contact point of the seventeenth switch SW17, an insulating capacitor C5-1 having one end connected to the second contact point at which the seventeenth and eighteenth switches SW17 and SW18 are commonly connected, a nineteenth switch SW19 having a first contact point which receives the reference voltage VCM and having a second contact point connected to the other end of the insulating capacitor C5-1, and a twentieth switch SW20 having a first contact point commonly connected to the second contact point of the nineteenth switch SW19 and the other end of the insulating capacitor C5-1 and having a second contact point connected to the one input terminal (e.g., the non-inverting input terminal) of the amplifier AMP.

In this case, the seventeenth and nineteenth switches SW17 and SW19 are simultaneously switched on/off by an NDQ1 signal (i.e., switched on in a high section and switched off in a low section), and the eighteenth and twentieth switches SW18 and SW20 are simultaneously switched on/off by an NDQ2 signal.

The fifth switching part 122 includes a twenty-first switch SW21 having a first contact point which receives a first positive measured voltage DAC1P (i.e., a voltage which is feedback of a positive voltage output from a first DAC DAC1 144 after the ST signal is delayed by one clock through a first D flip-flop 143, a twenty-second switch SW22 having a first contact point which receives the reference voltage VCM and having a second contact point commonly connected to a second contact point of the twenty-first switch SW21, an insulating capacitor C6-1 having one end connected to the second contact point at which the twenty-first and twenty-second switches SW21 and SW22 are commonly connected, a twenty-third switch SW23 having a first contact point which receives the reference voltage VCM and having a second contact point connected to the other end of the insulating capacitor C6-1, and a twenty-fourth switch SW24 having a first contact point commonly connected to the second contact point of the twenty-third switch SW23 and the other end of the insulating capacitor C6-1 and having a second contact point connected to the one input terminal (e.g., the non-inverting input terminal) of the amplifier AMP.

In this case, the twenty-first and twenty-third switches SW21 and SW23 are simultaneously switched on/off by the NDQ1 signal (i.e., switched on in the high section and switched off in the low section), and the twenty-second and twenty-fourth switches SW22 and SW24 are simultaneously switched on/off by the NDQ2 signal.

The sixth switching part 131 includes a twenty-sixth switch SW26 having a first contact point which receives an amplifier negative output voltage VOUTN (i.e., a voltage which is feedback of a negative voltage output from the amplifier AMP), a twenty-seventh switch SW27 having a first contact point which receives the reference voltage VCM and having a second contact point commonly connected to a second contact point of the twenty-sixth switch SW26, an insulating capacitor C5-2 having one end connected to the second contact point at which the twenty-sixth and twenty-seventh switches SW26 and SW27 are commonly connected, a twenty-eighth switch SW28 having a first contact point which receives the reference voltage VCM and having a second contact point connected to the other end of the insulating capacitor C5-2, and a twenty-ninth switch SW29 having a first contact point commonly connected to the second contact point of the twenty-eighth switch SW28 and the other end of the insulating capacitor C5-2 and having a second contact point connected to the other input terminal (e.g., the inverting input terminal) of the amplifier AMP.

In this case, the twenty-sixth and twenty-eighth switches SW26 and SW28 are simultaneously switched on/off by the NDQ1 signal (i.e., switched on in the high section and switched off in the low section), and the twenty-seventh and twenty-ninth switches SW27 and SW29 are simultaneously switched on/off by the NDQ2 signal.

The seventh switching part 132 includes a thirtieth switch SW30 having a first contact point which receives a first negative measured voltage DAC1N (i.e., a voltage which is feedback of a negative voltage output from the first DAC DAC1 144 after the ST signal is delayed by one clock through the first D flip-flop 143, a thirty-first switch SW31 having a first contact point which receives the reference voltage VCM and having a second contact point commonly connected to a second contact point of the thirtieth switch SW30, an insulating capacitor C6-2 having one end connected to the second contact point at which the thirtieth and thirty-first switches SW30 and SW31 are commonly connected, a thirty-second switch SW32 having a first contact point which receives the reference voltage VCM and having a second contact point connected to the other end of the insulating capacitor C6-2, and a thirty-third switch SW33 having a first contact point commonly connected to the second contact point of the thirty-second switch SW32 and the other end of the insulating capacitor C6-2 and having a second contact point connected to the other input terminal (e.g., the inverting input terminal) of the amplifier AMP.

In this case, the thirtieth and thirty-second switches SW30 and SW32 are simultaneously switched on/off by the NDQ1 signal (i.e., switched on in the high section and switched off in the low section), and the thirty-first and thirty-third switches SW31 and SW33 are simultaneously switched on/off by the NDQ2 signal.

For reference, the NDQ1 signal and the NDQ2 signal are output when the secondary integrator circuits 120 and 130 operate (i.e., when the ND signal is in the high section).

Meanwhile, the capacitor C2-1 and a fifteenth switch SW15, which are connected in series, are connected between the one input terminal (e.g., the non-inverting input terminal) and one output terminal (e.g., a VOUTP output terminal) of the amplifier AMP, the capacitor C4-1 and a fifteenth switch SW25, which are connected in series, are also connected between the one input terminal (e.g., the non-inverting input terminal) and the one output terminal (e.g., the VOUTP output terminal) of the amplifier AMP, and a reset switch RST is additionally connected between the one input terminal (e.g., the non-inverting input terminal) and the one output terminal (e.g., the VOUTP output terminal) of the amplifier AMP.

In addition, the capacitor C2-2 and a sixteenth switch SW16, which are connected in series, are connected between the other input terminal (e.g., the inverting input terminal) and the other output terminal (e.g., the VOUTN output terminal) of the amplifier AMP, the capacitor C4-2 and a thirty-fourth switch SW34, which are connected in series, are also connected between the other input terminal (e.g., the inverting input terminal) and the other output terminal (e.g., the VOUTN output terminal) of the amplifier AMP, and a reset switch RST is additionally connected between the other input terminal (e.g., the inverting input terminal) and the other output terminal (e.g., the VOUTN output terminal) of the amplifier AMP.

Here, when the ST signal is in the high section, the primary integrator circuit 110 operates, and thus the fifteenth and sixteenth switches SW15 and SW16 are switched on so that the amplifier AMP and the two capacitors C2-1 and C2-2 operate as an integrator. In addition, when the ND signal is in the high section, the secondary integrator circuits 120 and 130 operate, and thus the twenty-fifth and thirty-fourth switches SW25 and SW34 are switched on so that the amplifier AMP and the two capacitors C4-1 and C4-2 operate as an integrator.

Hereinafter, a configuration of the voltage output circuit 140 will be described.

The voltage output circuit 140 includes a comparator 141 connected to the one output terminal and the other output terminal of the amplifier AMP and configured to compare magnitudes of outputs (i.e., a finally modulated voltage through the primary integrator circuit and the secondary integrator circuits), an SR-latch 142 connected to one output terminal and the other output terminal of the comparator 141, the first D flip-flop 143 connected to one output terminal and the other output terminal of the SR-latch 142, the second D flip-flop 145 connected to one output terminal and the other output terminal of the first D flip-flop 143, and a digital filter 147 configured to filter and output voltages DOUT and DOUTB output from one output terminal and the other output terminal of the second D flip-flop 145.

That is, the digital filter 147 delays the output of the comparator 141 by a specified number of clocks according to the switching of the controller 150, passes the delayed output through the DAC to feed the delayed output back to the primary integrator circuit 110 and the secondary integrator circuits 120 and 130, and receives the delayed output signal of the comparator 141.

In addition, the first DAC DAC1 144 is connected parallel to the one output terminal and the other output terminal of the first D flip-flop 143 to feed the first positive measured voltage DAC1P and the first negative measured voltage DAC1N back to the secondary integrator circuits 120 and 130, and the second DAC DAC2 146 is connected parallel to the one output terminal and the other output terminal of the second D flip-flop 145 to feed the second positive measured voltage DAC2P and the second negative measured voltage DAC2N back to the primary integrator circuit 110.

In this case, the first D flip-flop 143 and the second D flip-flop 145 each receive the ST signal as a clock. That is, the first D flip-flop 143 feeds a value, which is output from the amplifier AMP and delayed by one clock by the ST signal, back to the secondary integrator circuits 120 and 130, and the second D flip-flop 145 feeds a value, which is output from the amplifier AMP and delayed by two clocks by the ST signal, back to the primary integrator circuit 110.

For reference, when the primary integrator circuit 110 operates, the value fed back from the second DAC DAC2 146 is a value of previous two clocks based on the ST (or ND) signal, and when the secondary integrator circuits 120 and 130 operate, the value fed back from the first DAC DAC1 144 is a value of a previous one clock based on the ST (or ND) signal. Therefore, the apparatus for measuring a voltage is configured such that the values obtained by delaying two clocks and one clock using the first and second D flip-flops 143 and 145 undergo DA conversion through the first DAC DAC1 144 and the second DAC DAC2 146 and are then fed back.

Thus, in the present embodiment, while the primary integrator circuit 110 and the secondary integrator circuits 120 and 130 actually use a single amplifier AMP, they operate, as shown in FIG. 2, in the same way as a circuit (e.g., a sigma-delta ADC circuit) in which the order of the ADC is increased using two amplifiers AMP. Rather, according to the present embodiment, while relatively further reducing the size of the circuit, there is an effect of increasing the voltage measurement speed to reduce the voltage measurement time and also to improve the voltage measurement accuracy.

FIG. 4 is a diagram illustrating a timing chart of control signals output from a controller to switches of the apparatus for measuring a voltage shown in FIG. 3.

Referring to FIG. 4, while the controller 150 outputs the ST signal in a high state, the fifth, sixth, fifteenth, and sixteenth switches SW5, SW6, SW15, and SW16 of the primary integrator circuit 110 are switched on, the primary integrator circuit 110 performs sampling in the high sections of the STX1 signal and the STQ1 signal (e.g., a former half high section of the ST signal), and the primary integrator circuit 110 performs an integral calculation (i.e., an integral calculation on a value fed back through the second D flip-flop 145 and the second DAC DAC2 146) in the high sections of the STX2 signal and the STQ2 signal (e.g., a latter half high section of the ST signal).

A value (that is, a measured voltage value) output after the integral calculation is completed by the primary integrator circuit 110 is fed back to the secondary integrator circuits 120 and 130 through the first D flip-flop 143 and the first DAC DAC1 144.

In addition, while the controller 150 outputs the ND signal in a high state, the twenty-fifth and thirty-fourth switches SW25 and SW34 of the secondary integrator circuits 120 and 130 are switched on, the secondary integrator circuits 120 and 130 perform sampling in the high section of the NDQ1 signal (e.g., a former half high period of the ND signal), and the secondary integrator circuits 120 and 130 perform an integral calculation (i.e., an integral calculation on a difference between a value fed back through the first D flip-flop 143 and the first DAC DAC1 144 and the value output from the amplifier) in the high section of the NDQ2 signal (e.g., a latter half high section of the ND signal).

That is, the controller 150 sequentially operates the primary integrator circuit 110 and the secondary integrator circuits 120 and 130 according to a switch control signal in the form of a pulse that is periodically output, so that, while the primary integrator circuit 110 and the secondary integrator circuits 120 and 130 actually use a single amplifier AMP, they operate, as shown in FIG. 2, in the same way as a circuit (e.g., a sigma-delta ADC circuit) in which the order of the ADC is increased using two amplifiers AMP. Rather, according to the present embodiment, while relatively further reducing the size of the circuit, there is an effect of increasing the voltage measurement speed to reduce the voltage measurement time and also to improve the voltage measurement accuracy.

Various embodiments are directed to an apparatus for measuring a voltage, which can improve accuracy and reduce a measurement time with a small area, when measuring a voltage of a battery cell or the like, by increasing an order of an analog-to-digital converter (ADC) without increasing the number of amplifiers of the ADC.

In accordance with the present disclosure, when measuring a voltage of a battery cell or the like, by increasing the order of an analog-to-digital converter (ADC) while not increasing the number of amplifiers (AMP), it is possible to relatively reduce a size of a circuit, to increase a voltage measurement speed to reduce a voltage measurement time and to improve voltage measurement accuracy.

Examples of the present disclosure provide an apparatus for measuring a voltage, which has an effect of increasing the order of the ADC without increasing the number of amplifier AMPs and thus can relatively reduce the size of the circuit compared to the case of increasing the number of amplifier AMPs, increase an operating speed of the circuit to increase a voltage measurement speed, and improve voltage measurement accuracy.

A number of embodiments have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An apparatus for measuring a voltage, comprising:
a primary integrator circuit configured to operate as a first integral stage of a sigma-delta analog-to-digital converter circuit when switched by a first control signal from a controller;
a secondary integrator circuit configured to operate as a second integral stage when switched by a second control signal from the controller;
a comparator configured to compare final voltages modulated through the primary integrator circuit and the secondary integrator circuit; and
a digital filter configured to
delay an output of the comparator by a specified number of clocks according to a switching of the controller,
pass the delayed output through a digital-to-analog converter to feed the delayed output back to the primary and secondary integrator circuits, and
receive the delayed output signal of the comparator as an input,
wherein an output of the digital filter becomes a final measured value,
wherein the controller sequentially operates the primary integrator circuit and the secondary integrator circuit.

2. The apparatus of claim 1, wherein:
the sigma-delta ADC includes an amplifier for an integrator;
the amplifier is used as an amplifier for an integrator of the primary integrator circuit when the primary integrator circuit operates; and
the amplifier is used as an amplifier for an integrator of the secondary integrator circuit when the secondary integrator circuit operates.

3. The apparatus of claim 1, wherein:
the controller is configured to output an ST signal to operate the primary integrator circuit and to output an ND signal to operate the secondary integrator circuit;
the primary integrator circuit is configured to operate when the ST signal is in a high section; and
the secondary integrator circuit is configured to operate when the ND signal, which is an inverted signal of the ST signal, is in a high section so that the controller sequentially operates the primary integrator circuit and the secondary integrator circuit.

4. The apparatus of claim 1, wherein:
the primary integrator circuit includes an integrating circuit formed of a first switching capacitor part and the amplifier;
the first switching capacitor part includes first, second, and third switching parts;
the first switching part includes:
first and second switches having first contact points commonly connected to a positive terminal of a battery cell; and
third and fourth switches having first contact points commonly connected to a negative terminal of the battery cell; and
second contact points of the first and third switches are commonly connected;
second contact points of the second and fourth switches are commonly connected;
one set of ends of insulating capacitors having the same value are connected in series to the second contact points of the first and third switches and to the second contact points of the second and fourth switches; and
a fifth switch and a sixth switch are connected in series to the other set of ends of the insulating capacitors to be connected to one input terminal and the other input terminal of the amplifier.

5. The apparatus of claim 4, wherein:
the first and fourth switches are configured to be simultaneously switched on/off by an STX1 signal;
the second and third switches are configured to be simultaneously switched on/off by an STX2 signal which is an inverted signal of the STX1 signal; and
the fifth and sixth switches are configured to be simultaneously switched on/off by the ST signal.

6. The apparatus of claim 1, wherein:
the secondary integrator circuit includes an integrating circuit formed of a second switching capacitor part and the amplifier;
the second switching capacitor part includes fourth, fifth, sixth, and seventh switching parts;
the fourth switching part includes:
a seventeenth switch having a first contact point configured to receive an amplifier positive output voltage;
an eighteenth switch having a first contact point configured to receive the reference voltage and having a second contact point commonly connected to a second contact point of the seventeenth switch;
an insulating capacitor having one end connected to the second contact point at which the seventeenth and eighteenth switches are commonly connected;
a nineteenth switch having a first contact point configured to receive the reference voltage and having a second contact point connected to the other end of the insulating capacitor; and
a twentieth switch having a first contact point commonly connected to the second contact point of the nineteenth switch and the other end of the insulating capacitor and having a second contact point connected to the one input terminal of the amplifier; and
the amplifier positive output voltage is a voltage that is feedback of a positive voltage output from the amplifier.

7. The apparatus of claim 6, wherein the seventeenth and nineteenth switches are configured to be simultaneously switched on/off by an NDQ1 signal, and the eighteenth and twentieth switches are simultaneously switched on/off by an NDQ2 signal.

8. The apparatus of claim 6, wherein the sixth switching part includes:
a twenty-sixth switch having a first contact point configured to receive an amplifier negative output voltage;
a twenty-seventh switch having a first contact point configured to receive the reference voltage and having a second contact point commonly connected to a second contact point of the twenty-sixth switch;
an insulating capacitor having one end connected to the second contact point at which the twenty-sixth and twenty-seventh switches are commonly connected;
a twenty-eighth switch having a first contact point configured to receive the reference voltage and having a second contact point connected to the other end of the insulating capacitor; and
a twenty-ninth switch having a first contact point commonly connected to the second contact point of the twenty-eighth switch and the other end of the insulating capacitor and having a second contact point connected to the other input terminal of the amplifier,
wherein the amplifier negative output voltage is a voltage that is feedback of a negative voltage output from the amplifier.

9. The apparatus of claim 1, wherein:
a first capacitor and a fifteenth switch, which are connected in series, are connected between one input terminal and one output terminal of the amplifier;
a second capacitor and a twenty-fifth switch, which are connected in series, are connected between the one input terminal and the one output terminal; a reset switch is connected between the one input terminal and the one output terminal; and
a third capacitor and a sixteenth switch, which are connected in series, are connected between the other input terminal and the other output terminal of the amplifier;
a fourth capacitor and a thirty-fourth, which are connected in series, are connected between the other input terminal and the other output terminal; and
a reset switch is connected between the other input terminal and the other output terminal.

10. The apparatus of claim 1, comprising:
a voltage output circuit,
wherein the voltage output circuit includes:
a first D flip-flop configured to receive one output and the other output of the comparator;
a second D flip-flop connected to one output terminal and the other output terminal of the first D flip-flop; and
a digital filter configured to filter and output voltages output from one output terminal and the other output terminal of the second D flip-flop,
a first DAC is connected parallel to the one output terminal and the other output terminal of the first D flip-flop to feed a first positive measured voltage and a first negative measured voltage back to the secondary integrator circuit, and
a second DAC is connected parallel to the one output terminal and the other output terminal of the second D flip-flop to feed a second positive measured voltage and a second negative measured voltage back to the primary integrator circuit.

* * * * *